United States Patent [19]

Keller

[11] 3,939,436

[45] Feb. 17, 1976

[54] REVERBERATION DEVICE

[75] Inventor: Hans Keller, Gundelfingen, Germany

[73] Assignee: ITT Industries, Inc., New York, N.Y.

[22] Filed: Nov. 22, 1974

[21] Appl. No.: 526,342

[30] Foreign Application Priority Data

Dec. 7, 1973 Germany............................ 2360983

[52] U.S. Cl. .............. 330/84; 84/DIG. 26; 330/151

[51] Int. Cl.$^2$ ............................................ H03F 3/68

[58] Field of Search ......... 330/21, 85, 107, 75, 109, 330/84, 151; 84/1.24, DIG. 10, DIG. 26; 179/1 J; 333/29

[56] References Cited

UNITED STATES PATENTS 3,761,629 9/1973 Suzuki ............................ 84/1.24 X

OTHER PUBLICATIONS

Schroeder, "Natural Sounding Artificial Reverberation," Journal of the Audio Engineering Society, Vol. 10, No. 3, July 1962, pp. 219–223.

*Primary Examiner*—James B. Mullins
*Attorney, Agent, or Firm*—John T. O'Halloran; Menotti J. Lombardi, Jr.; Peter Van Der Sluys

[57] ABSTRACT

A reverberation device is provided with a delay line in series with an amplifier which is designed to compensate for the inherent frequency dependent attenuation of the delay line. The output of the compensating amplifier is fed back directly to the delay line input.

11 Claims, 6 Drawing Figures

REVERBERATION DEVICE

BACKGROUND OF THE INVENTION

1. Field of the Invention

The present invention relates to reverberation devices and more particularly to such devices having a feedback delay line.

2. Description of the Prior Art

Electronic reverberation devices are used for achieving special effects in generating, recording or reproducing sound events, at least approximately simulating the reverberant sound effects of a larger room. Such reverberation devices are used, for example, in electronic organs.

As disclosed in an article by M. R. Schroeder in the "Journal of the Audio Engineering Society" (July, 1962), Vol. 10, No. 3, pp. 219 to 223, a simple electronic reverberation device according to FIG. 1 can be formed in such a way that the signal which is intended to die away, is fed to a delay line D, and that the output signal, via an amplifier with the gain $g < 1$ and a linear adder circuit A, is re-applied to the input of the line. The degree of amplification g is determined by the required reverberation time and by the delay time of the employed delay line.

It is described by M. R. Schroeder that the frequency-dependent phase position of the output signal of the delay line in a reverberation device according to FIG. 2, causes the reverberation device to have an interdigitated filter characteristic. The author, without actually implying same, proceeds in his considerations from the fact that the amount of the line attenuation $|g_d| = 1$. This, however, is not the case in practice, in fact, known types of delay lines, whether mechanical, acoustic, electromagnetic or electronic, all have a frequency-dependent attenuation $|g_d| = \phi(f)$. Therefore, in the circuit arrangement as disclosed by M. R. Schroeder, the output signal of the reverberation device as well as the reverberation time will show an unwanted frequency response.

SUMMARY OF THE INVENTION

Accordingly, the invention relates to a reverberation device employing a delay line the output of which is fed back. By the invention, the aforementioned problem is solved in that before the output of the reverberation device and in series with the delay line, an amplifier is connected for at least partly compensating the frequency-dependent amount of the line attenuation, and in that no amplifier is connected into the feedback path between the output and the input of the delay line.

For compensating the frequency-dependent attenuation, the frequency-dependent amplification (gain) $g_x = \phi(f)$, in the optimum case, is chosen thus that the relationship $$1 > g_d \cdot g_x \neq \phi(f)$$

is met, and that the product will become frequency-independent.

It is an object of the invention to avoid the unwanted frequency characteristics displayed by reverberation devices of the prior art.

The foregoing and other objectives and advantages of the present invention will become more apparent from the following description and the accompanying drawings wherein one embodiment of the present invention is described.

DESCRIPTION OF THE PREFERRED EMBODIMENTS

Figure 1:
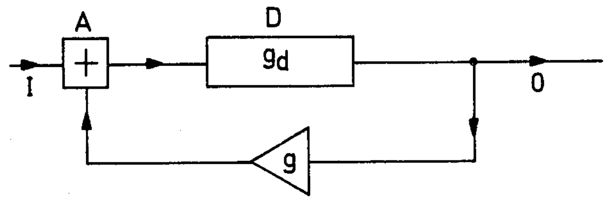
Fig.1 PRIOR ART
FIG. 1 is a block diagram of a known type of reverberation device.
Figure 2:
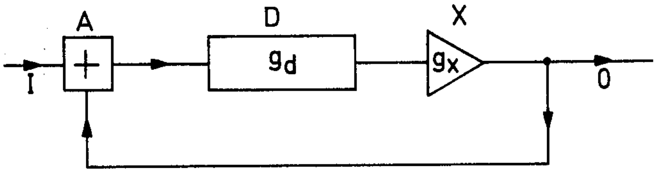
FIGS. 2 and 3 are block diagrams of two alternative solutions relating to a reverberation device according to the invention.

In the reverberation device shown in FIG. 2, the amplifier X, unlike the amplifier in the above-mentioned article shown in FIG. 1, is not arranged in the feedback path, but in series with the delay line D before the output O of the reverberation device. The output of amplifier X is fed back to a first input of an adding circuit A which has a second input connected to the reverberation device input I. Adding circuit A has an output connected to the input of delay line D.

Figure 3:
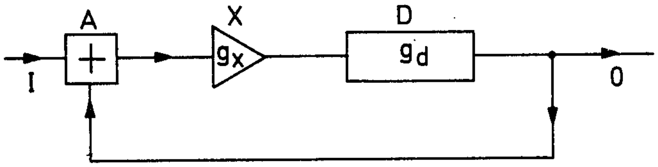
Figure 4:
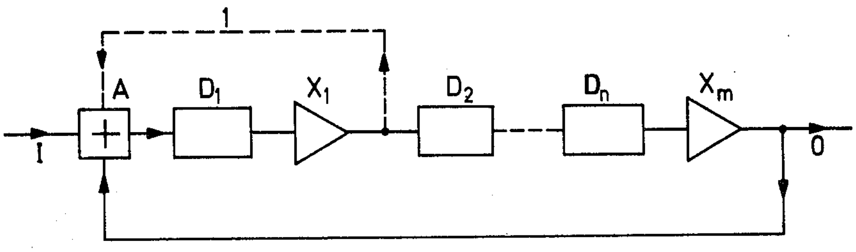
FIG. 4 is a block diagram of a further type of embodiment employing a divided delay line and a divided amplifier in series.

Additional embodiments of the series arrangement of both the delay line D and the amplifier X are possible, of which some examples are shown in FIGS. 3 and 4.

In the types of embodiment according to FIGS. 2 and 3, the amplifier X, when looked at from the input I, is connected either behind or before the delay line D.

In the case of a divided delay line D as shown in FIG. 4, i.e. divided into the partial lines $D_1, D_2 \ldots D_n$, and by dividing the amplifier X into partial amplifiers $X_1, X_2 \ldots X_m$, it is possible to introduce from the output of one of the partial lines $D_1, D_2 \ldots D_n$ or from the output of one of the partial amplifiers $X_1, X_2 \ldots X_m$, also additional feedback paths, as is indicated by the broken line 1. It is also possible for the amplifier X alone to be divided into partial amplifiers $X_1, X_2 \ldots X_m$, without the delay line D having to be divided, or else also the delay line D alone may be divided into partial lines $D_1, D_2 \ldots D_n$, without the amplifier X having to be divided.

According to M. R. Schroeder's description, and owing to the interdigitated filter characteristics, resonance points of low density will appear at the output of a simple reverberation device within the frequency range, which are likely to falsify the sound impression to a considerable extent and, for the compensation of which, it will be necessary to enlarge the circuit by one attenuating stage Y having the "gain" $g_y = 1 - g^2$, an inverter stage Z having the "gain" $g_z = -g$, as well as a further adder stage $A_2$.

Also in the already described reverberation devices according to the invention it is possible for the resonance points to be compensated by means of additional stages; for this purpose, of course, in a first further embodiment of the invention, the attenuating stage Y is not connected, in the known manner, between the delay line D and the amplifier X, but behind the series arrangement of both (FIG. 5), and with respect to the optimal case, the stages are dimensioned in such a way as to satisfy the relationship $$\frac{g_y}{g_z} = 1 - \frac{1}{|g_d|^2 \cdot g_x^2}.$$

Figure 5:
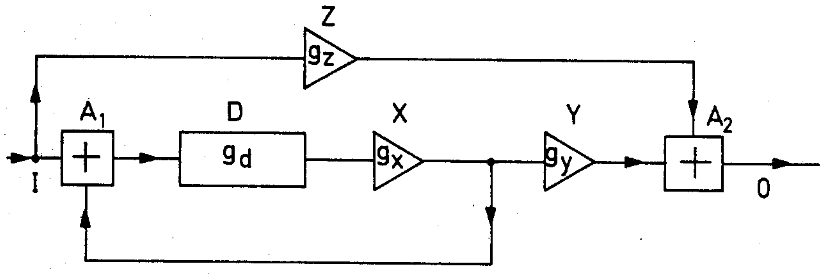
FIGS. 5 and 6 are block diagrams of further embodiments relating to a reverberation device according to the invention.

In the reverberation device according to FIG. 5, the signal as conducted via the delay line D and the amplifier X, is fed to a second adder stage $A_2$ to the further input of which there is moreover applied the input signal of the reverberation device via an additional amplifier Z. Behind the series arrangement of both the delay line D and the amplifier X, and before the adder stage $A_2$ it is possible to insert an attenuator Y.

Figure 6:
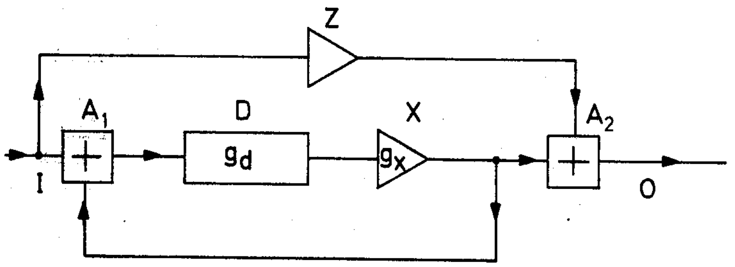

In a second further embodiment of the reverberation device according to the invention, and as shown in FIG. 6, the attenuator Y is saved completely, i.e., $g_y$ is adjusted = 1, and $$g_z \text{ is chosen} = -\frac{|g_d|^2 \cdot g_x^2}{1-|g_d|^2 \cdot g_x^2}.$$

The additional amplifier Z in the reverberation device according to FIG. 6 or the additional amplifier Z and the attenuator Y in the reverberation device according to FIG. 5 are normally laid out for an optimal compensation or, for the purpose of achieving special sound effects, for a partial compensation of the interdigitated filter characteristic of the reverberation device.

In the reverberation device according to the invention it is possible to use either a mechanical, accoustic or electro-magnetic delay line. Particularly favorable and space-saving, however, is the use of an electronic delay line in the shape of an integrated circuit manufactured in accordance with the known MOS-technique. Apart from the stages of the delay line, also the series-arranged amplifier, the adder stage(s) and/or the additional amplifier, as well as, if necessary, the attenuator, may all be included in the integrated circuit.

The parts of the reverberation may also be designed in the form of at least two integrated circuits. This is advisable in cases where the integrated circuits are manufactured in accordance with different technologies. Thus, for example, it is favorable for the integrated delay line to be manufactured in accordance with the MOS-technique, and the further electronic parts of the reverberation device, in accordance with the bipolar-technique.

What is claimed is:

1. A reverberation device, comprising:
 an input terminal;
 a first adding circuit having first and second inputs and an output, the first being connected to the input terminal;
 a delay line having an input and an output, said delay line having predetermined frequency dependent gain characteristics;
 a compensating amplifier having an input and an output, said amplifier having frequency dependent gain characteristics corresponding to the characteristics of the delay line, said delay line and compensating amplifier being connected in series;
 an output terminal, said series connected delay line and compensating amplifier being disposed between the output of the first adding circuit and the output terminal; and
 a feedback line connecting the output of the series connected delay line and compensating amplifier to the second input of the first adding circuit.

2. A reverberation device as described in claim 1, wherein the input of the compensating amplifier is connected to the output of the delay line.

3. A reverberation device as described in claim 1, wherein the output of the compensating amplifier is connected to the input of the delay line.

4. A reverberation device as described in claim 1, wherein the delay line comprises a plurality of delay lines and the compensating amplifier comprises a plurality of amplifiers.

5. A reverberation device as described in claim 4, additionally comprising, an additional feedback line is connected from the output of one of said delay lines and amplifiers to a third input of the adding circuit.

6. A reverberation device as described in claim 1, additionally comprising:
 a second adding circuit having first and second inputs and an output said output being connected to the output terminal and said first input being connected to the output of the series connected delay line and compensating amplifier; and
 a second amplifier having an input connected to the input terminal and an output connected to the second input of the second adding circuit.

7. A reverberation device as described in claim 6, additionally comprising:
 an attenuator disposed between the output of the series connected delay line and compensating amplifier and the first input of the second adding circuit.

8. A reverberation device as described in claim 7, wherein the delay line has a gain of $g_d$, the compensating amplifier has a gain of $g_x$, the attenuator has a gain of $g_y$ and the second amplifier has a gain of $g_z$, said gains are dimensioned to satisfy the relationship $$\frac{g_y}{g_z} = 1 - \frac{1}{|g_d|^2 \cdot g_x^2}.$$

9. A reverberation device as described in claim 8, wherein the gain $g_y$ is adjusted to equal substantially 1 and the gain $$g_z = -\frac{|g_d|^2 \cdot g_x^2}{1-|g_d|^2 \cdot g_x^2},$$

whereby the attenuator may be a conductor.

10. A reverberation device as described in claim 1, having an electronic delay line.

11. A reverberation device as described in claim 10, wherein the electronic delay line is an MOS device.

* * * * *